United States Patent
El-Batal

(10) Patent No.: US 11,317,533 B2
(45) Date of Patent: Apr. 26, 2022

(54) HEAT SINK ARRANGEMENTS FOR DATA STORAGE SYSTEMS

(71) Applicant: Seagate Technology LLC, Fremont, CA (US)

(72) Inventor: Mohamad El-Batal, Superior, CO (US)

(73) Assignee: Seagate Technology LLC, Fremont, CA (US)

( * ) Notice: Subject to any disclaimer, the term of this patent is extended or adjusted under 35 U.S.C. 154(b) by 46 days.

(21) Appl. No.: 17/019,814

(22) Filed: Sep. 14, 2020

(65) Prior Publication Data

US 2022/0087056 A1 Mar. 17, 2022

(51) Int. Cl.
*H05K 7/20* (2006.01)
*H05K 7/14* (2006.01)

(52) U.S. Cl.
CPC ....... *H05K 7/20154* (2013.01); *H05K 7/1427* (2013.01); *H05K 7/2039* (2013.01)

(58) Field of Classification Search
CPC ............. H05K 7/1427; H05K 7/20154; H05K 7/2039; H05K 7/20729
See application file for complete search history.

(56) References Cited

U.S. PATENT DOCUMENTS

| | | | |
|---|---|---|---|
| 6,421,240 B1 * | 7/2002 | Patel | H05K 7/20763 165/104.33 |
| 10,488,892 B1 * | 11/2019 | Lin | H05K 5/0086 |
| 2004/0264124 A1 * | 12/2004 | Patel | G06F 1/20 361/679.46 |
| 2007/0223200 A1 * | 9/2007 | Fujiya | H05K 7/20727 361/727 |
| 2008/0055868 A1 * | 3/2008 | Peterson | H05K 7/20727 361/752 |
| 2008/0278916 A1 * | 11/2008 | Hsieh | H01L 23/467 361/711 |
| 2015/0261265 A1 * | 9/2015 | Dean | H05K 1/147 361/679.31 |
| 2020/0137923 A1 * | 4/2020 | Qu | H05K 7/20145 |

OTHER PUBLICATIONS

Morgan, Thomthy Prickett, "Gen-Z Memory Servers Loom on the Horizon," The Next Platform, Jan. 9, 2020.

* cited by examiner

*Primary Examiner* — Jacob R Crum
(74) *Attorney, Agent, or Firm* — Faegre Drinker Biddle & Reath LLP

(57) ABSTRACT

A system includes an enclosure with an air inlet end, an air outlet end, an upper wall, and a lower wall. The system also includes air movers positioned near the air outlet end, a first memory module positioned near the air inlet end at a first orientation, and a second memory module positioned near the air inlet end at a second orientation that is opposite the first orientation.

20 Claims, 7 Drawing Sheets

HEAT SINK ARRANGEMENTS FOR DATA STORAGE SYSTEMS

SUMMARY

In certain embodiments, a system includes an enclosure with an air inlet end, an air outlet end, an upper wall, and a lower wall. The system also includes air movers positioned near the air outlet end, a first memory module positioned near the air inlet end at a first orientation, and a second memory module positioned near the air inlet end at a second orientation that is opposite the first orientation.

In certain embodiments, an enclosure includes a chassis including a lower wall and an upper wall, a first row of memory module assemblies, a second row of memory module assemblies, a first set of heat sinks respectively thermally coupled to one of the memory module assemblies in the first row. The first set of heat sinks are positioned between the lower wall and the memory module assemblies in the first row. The enclosure also includes a second set of heat sinks respectively thermally coupled to one of the memory module assemblies in the second row. The second set of heat sinks are positioned between the upper wall and the memory module assemblies in the second row.

In certain embodiments, a method for cooling electronic components positioned within an enclosure is disclosed. The enclosure includes a top wall and a bottom wall. The method includes operating air movers within the enclosure to pull air between a first set of fins of a first heat sink and between a second set of fins of a second heat sink. The first heat sink is connected to a first memory module and positioned between the bottom wall and the first memory module. The second heat sink is connected to a second memory module and positioned between the top wall and the second memory module.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

Figure 1:
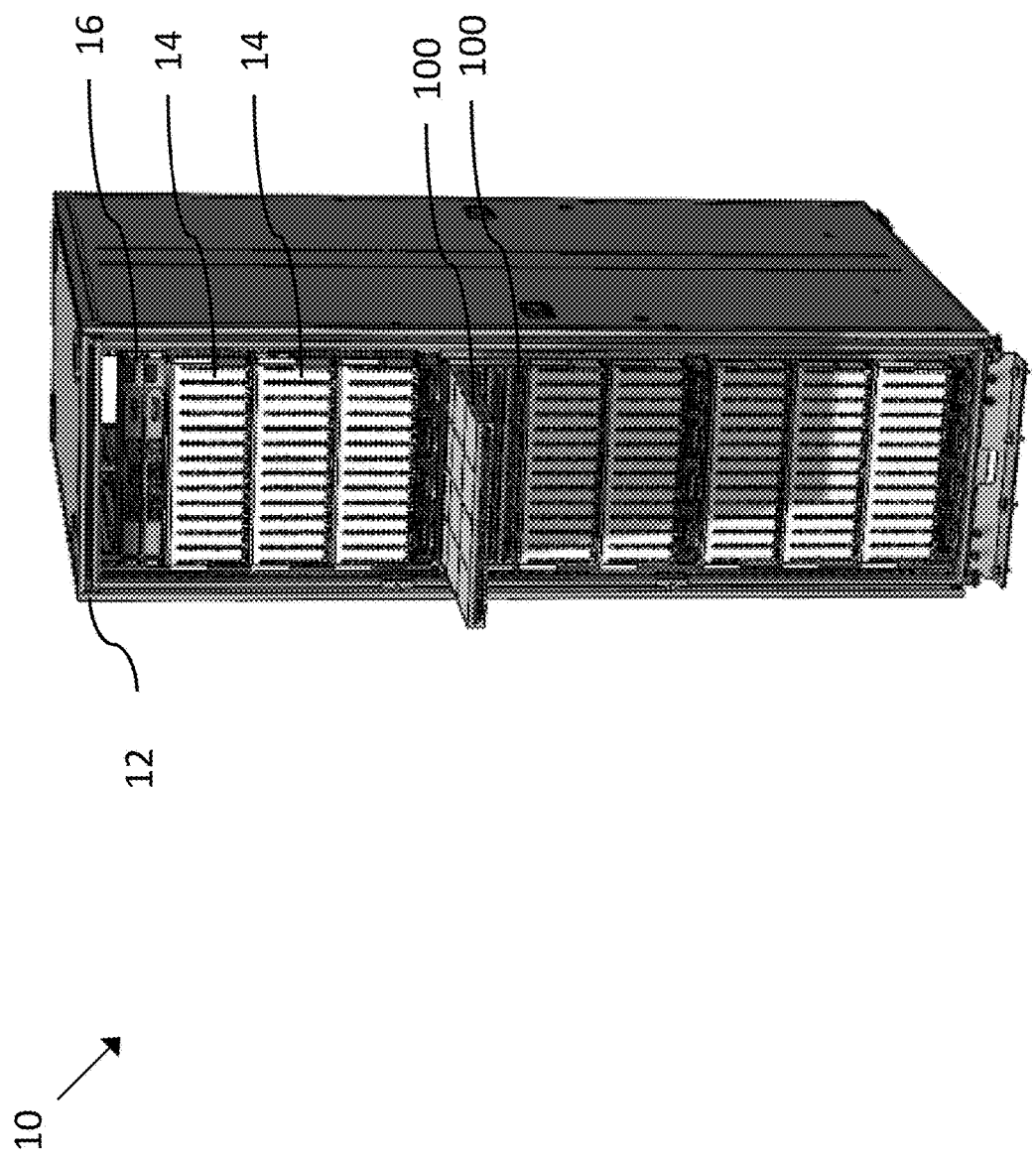
FIG. 1 shows a data storage system, in accordance with certain embodiments of the present disclosure.

While the disclosure is amenable to various modifications and alternative forms, specific embodiments have been shown by way of example in the drawings and are described in detail below. The intention, however, is not to limit the disclosure to the particular embodiments described but instead is intended to cover all modifications, equivalents, and alternatives falling within the scope of the appended claims.

DETAILED DESCRIPTION

Data storage systems can utilize one or more enclosures, which house data storage devices and electronic equipment. These devices and equipment generate heat, which can be challenging to manage in enclosures. Certain embodiments of the present disclosure are directed to systems, methods, and devices for managing heat within enclosures.

FIG. 1 shows a data storage system 10 including a rack 12 (e.g., a cabinet) with multiple mass-storage enclosures 14 (e.g., 4-unit (4U) enclosures) and separate power shelfs 16, which house power supply units to power various data storage devices, cooling units, and other electronics of the data storage system 10.

The data storage system 10 includes one or more enclosures 100, one of which is shown in FIG. 1 partially pulled out of the rack 12. Various features of the enclosure 100 are shown in more detail in FIGS. 2-7.

Figure 2:
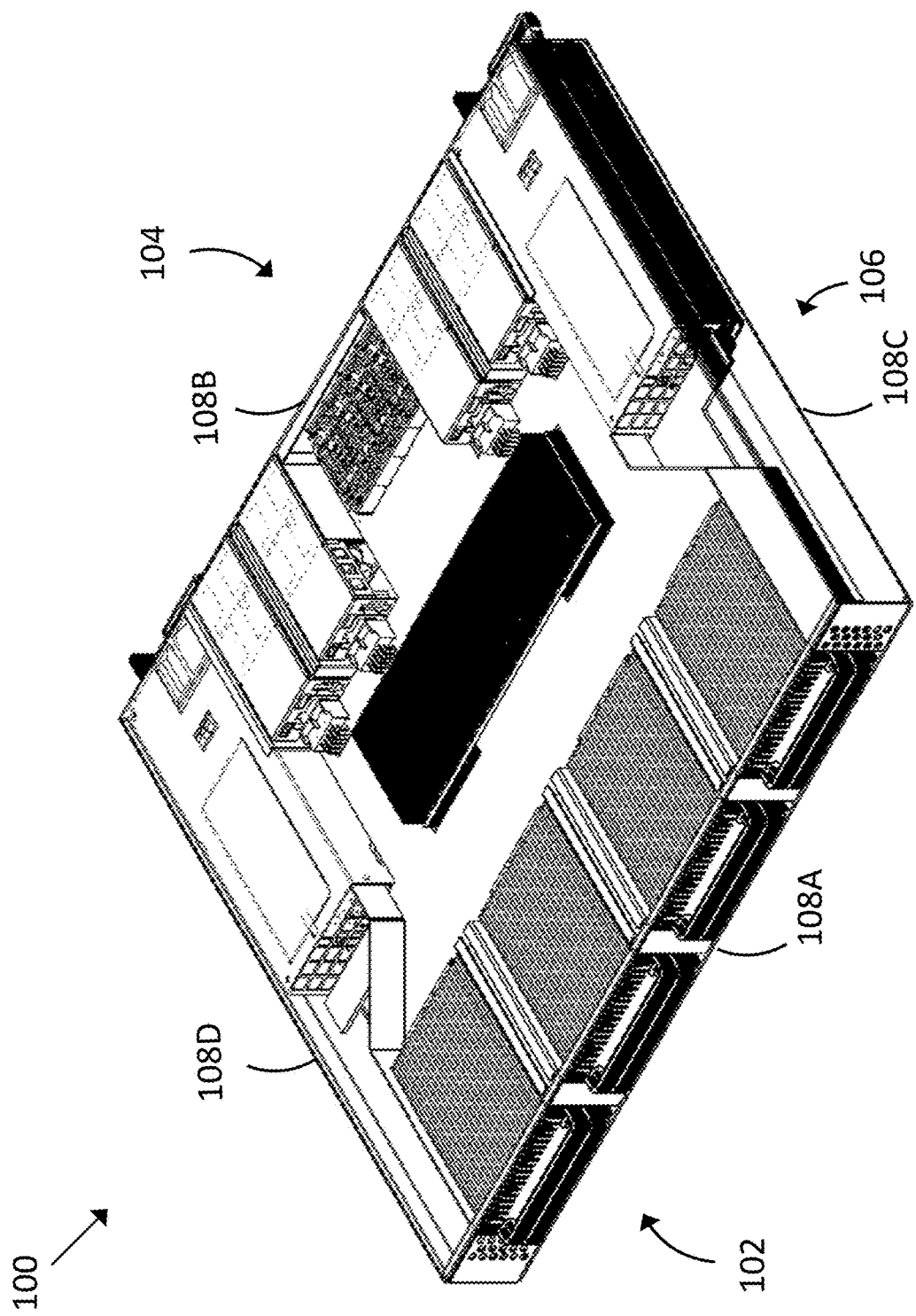
FIG. 2 shows a schematic perspective view of an enclosure of the data storage system of FIG. 1, in accordance with certain embodiments of the present disclosure.

FIG. 2 shows a schematic perspective view of the enclosure 100. The enclosure 100 includes a front end 102, which can be referred to as the air inlet end, and a back end 104, which can be referred to as the air outlet end. The enclosure 100 includes a chassis 106 with a lower wall 108A, an upper wall 1086, a first side wall 108C, and a second side wall 108D. In certain embodiments, the enclosure 100 is a 1U-sized enclosure. In such embodiments, the enclosure 100 is sized to be inserted into and removed from slots in racks sized for 1U enclosures. Although the enclosure 100 is described as a 1U-sized enclosure, the features of the enclosure 100 described in more detail below can be used in other sized enclosures.

Figure 3:
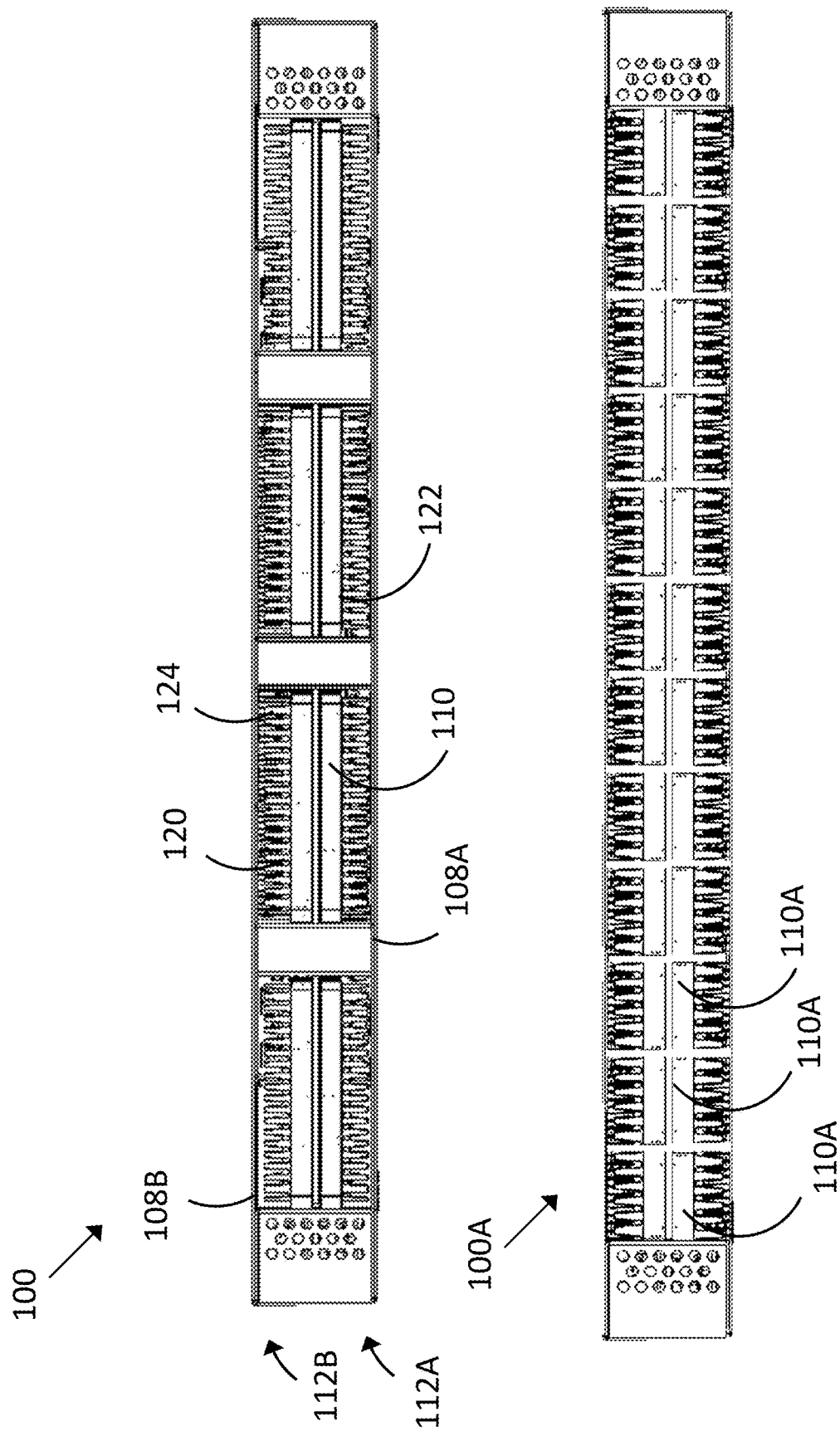
FIG. 3 shows schematic front views of alternative arrangements of memory modules for the enclosure of FIG. 2, in accordance with certain embodiments of the present disclosure.
Figure 4:
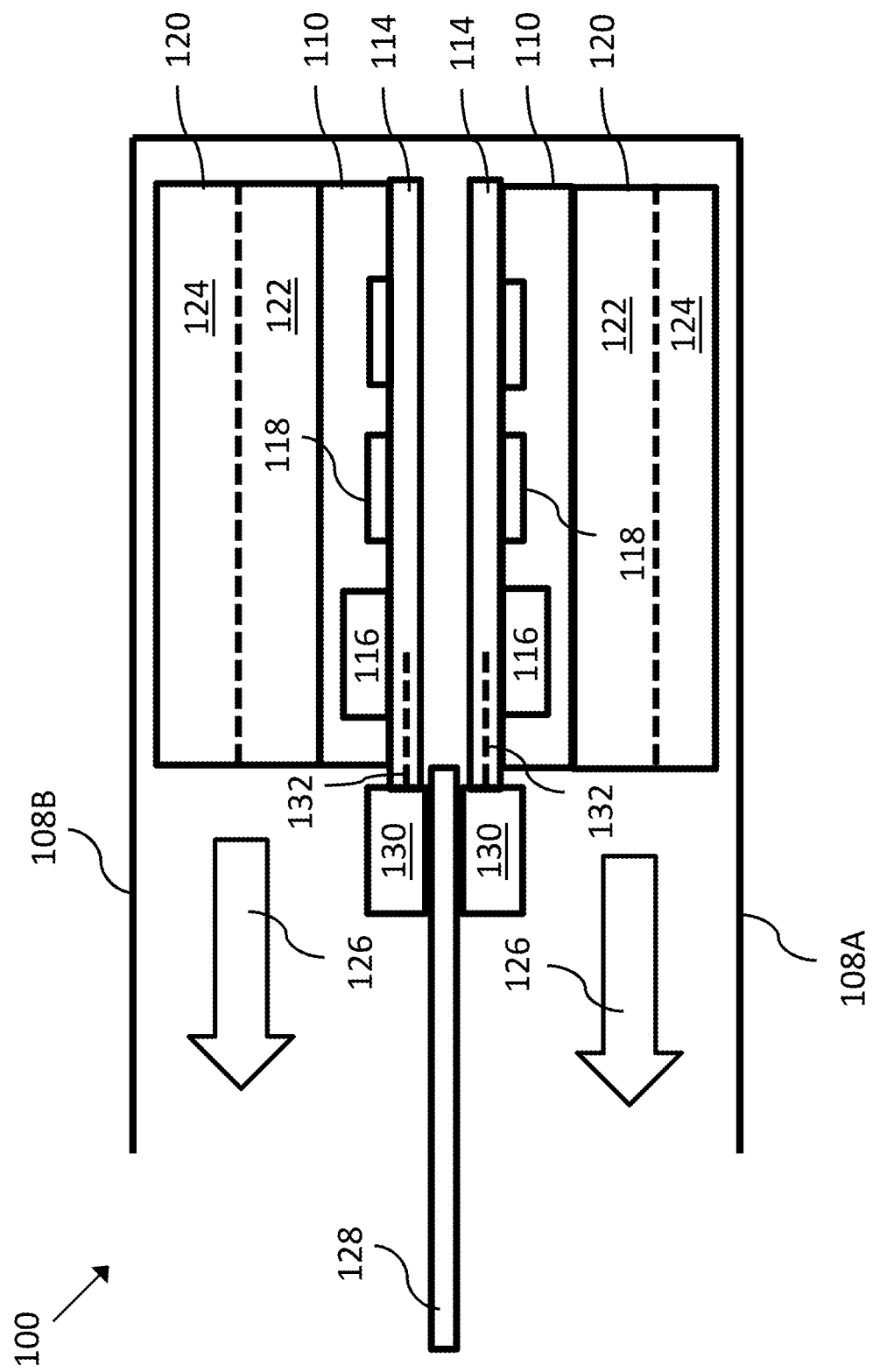
FIG. 4 shows a schematic side cut-away view of a portion of the enclosure of FIGS. 2 and 3, in accordance with certain embodiments of the present disclosure.
Figure 5:
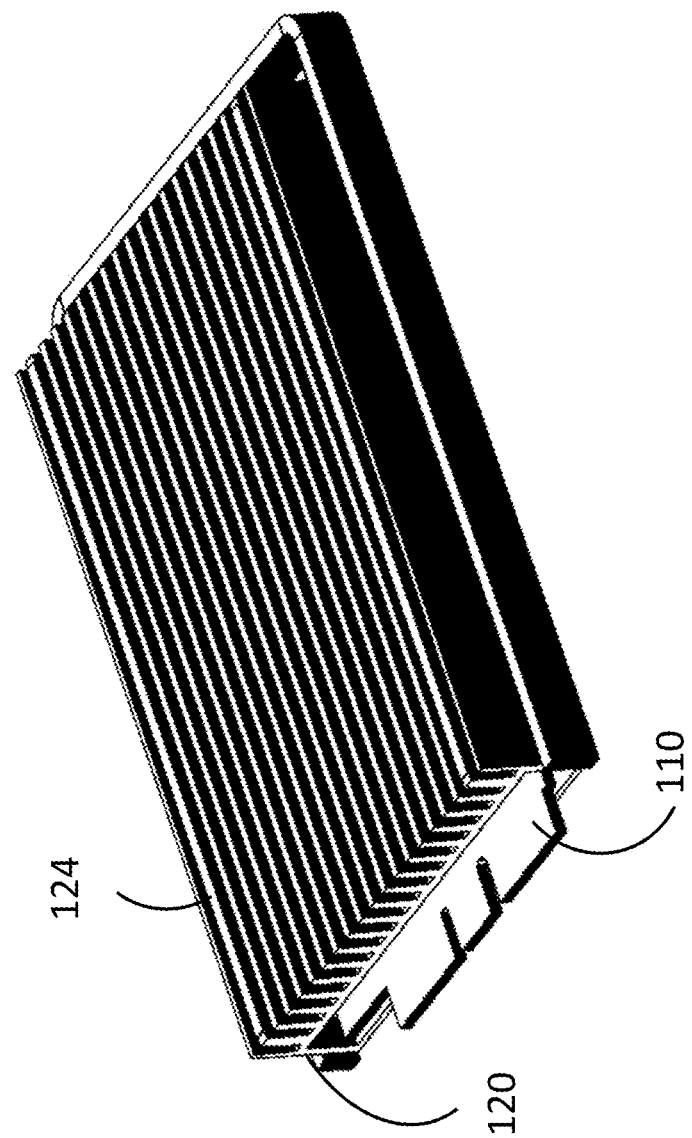
FIG. 5 shows an isometric view of a memory module and heat sink assembly, in accordance with certain embodiments of the present disclosure.

FIG. 3 shows a schematic front view of the enclosure 100, FIG. 4 shows a schematic side cut-away view of a portion of the enclosure 100 near the front end 102, and FIG. 5 shows a memory module and heat sink assembly. As shown in FIGS. 3 and 4, the enclosure 100 includes memory modules 110 positioned near the front end 102 or air inlet end of the enclosure 100. The enclosure 100 includes a lower row 112A of memory modules 110 and an upper row 112B of memory modules 110.

FIG. 4 shows the memory modules 110 (e.g., memory module assemblies) including a printed circuit board 114, a controller integrated circuit 116 (e.g., an application-specific integrated circuit), and one or more memory chips 118 (each containing many memory cells). The memory chips 118 can comprise storage-class memory cells such as MRAM memory cells, ReRAM memory cells, DRAM memory cells, among many other potential types of memory cells useful in the memory chips 118. The components of the memory modules 110 function to process and store data. In certain embodiments, the memory modules 110 include features to function under, or comply with, the EDSFF E3.S 16-lane standards, in which a Gen-Z Memory Module (ZMM) or CXL Memory Module (XMM) implementations are considered possible solutions.

When powered on and operating, the memory modules 110 will generate heat. ZMM or XMM memory modules, under EDSFF-E3.S standards, may use 30 to 75 watts of power. And, under EDSFF-E1.S standards, memory modules can consume 10 to 25 watts of power. To help cool the memory modules 110, the memory modules 110 can be coupled to one or more heat sinks 120, which comprise materials such as aluminum that have a relatively high coefficient of thermal conductivity. The heat generated by the memory modules 110 can be transferred to the heat sinks 120 to reduce the temperature of the memory modules 110.

As shown in FIG. 3, the heat sinks 120 can each include a base 122 (e.g., base portion of the heat sinks 120) with a set of fins 124 (e.g., finned portion of the heat sinks 120) extending from the base 122. The base 122 and the fins 124 can form a single integral structure where the base 122 and the fins 124 are not separate components coupled together. The base 122 can be coupled (e.g., directly coupled) to the memory module 110 such that at least a portion (e.g., bottom surface) of the base 122 is in contact with the memory module 110. In certain embodiments, one or more structures or materials are positioned between the memory modules 110 and the heat sinks 120 to facilitate heat transfer from the memory modules 110 to the heat sinks 120. In certain embodiments, the memory module 110 has an outer housing with the controller integrated circuit 116 and one or more memory chips 118 positioned within a cavity of the housing. In such embodiments, the base 122 can be attached to a portion of the housing.

The fins 124 can be spaced from each other such that there are gaps between the fins 124. In certain embodiments, the heat sinks 120 includes scores or hundreds of thin fins 124 with small gaps therebetween. The gaps allow air to pass through the heat sinks 120. As shown in FIG. 4 by arrows 126 (representing the direction of air flow), air flows in a direction such that the air first enters the enclosure 100 at the front end 102 and passes through the heat sink 120 (e.g., in between the fins 124). As the memory modules 110 generate heat, the heat is conducted to the heat sink 120 at the base 122 and travels to the fins 124, which are convectively cooled by the air passing across the fins 124. The air is heated as it passes through the heat sink 120.

As shown in FIGS. 3 and 4, the memory modules 110 in the lower row 112A are oriented differently than the memory modules 110 in the upper row 112B. More specifically, the memory modules 110 in the lower row 112A are oriented such that the heat sinks 120 are positioned underneath the memory modules 110 (e.g., between the lower wall 108A and the memory module 110), while the memory modules 110 in the upper row 112B are oriented such that the heat sinks 120 are positioned above the memory modules 110 (e.g., between the upper wall 108B and the memory module 110).

As such, the memory modules 110 in the lower row 112A can be said to have an orientation that is the opposite (e.g., flipped or rotated approximately 180 degrees) of the memory modules 110 in the upper row 112B. In such an orientation, the printed circuit boards 114 of the memory modules 110 are both positioned between the heat sinks 120 of the respective memory modules 110.

Although the enclosure 100 is shown with 4 memory modules 110 per row, the enclosure 100 can include additional memory modules (e.g., 5 per row for a total of 10 memory modules 110 in the enclosure 100). As another example, the lower enclosure 100A in FIG. 3 shows an alternative arrangement of memory modules. In this example, instead of a single memory module and heat sink, the space is used for three individual memory modules 110A each with their own heat sink and electrical connector—although a single heat sink for each group of three memory modules could be used. As such, the enclosure 100A includes 24 memory modules 110 such as E1.S modules.

As shown in FIG. 4, the enclosure 100 includes a printed circuit board 128 that is electrically coupled to the memory modules 110. To distinguish the printed circuit board 128 from those of the memory modules 110, the printed circuit board 128 will be referred to as the motherboard 128. The motherboard 128 transfers power to the memory modules 110. Further, the motherboard 128 communicates data to and from the memory modules 110. As shown in FIG. 4, the motherboard 128 includes electrical connectors 130 for coupling to each memory module 110. For example, one electrical connector 130 is positioned on a bottom side of the motherboard 128 for connecting to one memory module 110, and another electrical connector 130 is positioned on a top side of the motherboard 128 for connecting to another memory module 110. Interfaces of respective memory modules 110 can be inserted into respective electrical connectors 130.

With the orientations of the memory modules 110, a single printed circuit board (e.g., the motherboard 128) can be used to electrically connect to the memory modules 110 without intervening printed circuit boards. In a typical data storage enclosure, a first printed circuit board extends horizontally near the bottom wall of the enclosure. A second printed circuit board, which is sometimes referred to as a mid-plane circuit board, extends vertically (e.g., perpendicularly) from the first printed circuit board. Because of its vertical orientation, the mid-plane circuit board blocks airflow which reduces the ability to maintain the enclosure within desired temperature ranges. However, with the orientations of the memory modules 110, the motherboard 128 does not require a separate mid-plane circuit board. Instead, the motherboard 128 can extend along a plane that extends between the memory modules 110. In certain embodiments, the motherboard 128 can be considered a "floating" motherboard in that the motherboard 128 is not necessarily support by the bottom wall 108A or floor of the chassis 106. For example, the motherboard 128 can be supported by support structures connected to or formed by the sidewalls 108C and 108D of the chassis 106.

With the arrangement of the memory modules 110 and the motherboard 128, the airflow 126 can pass from the front end 102 of the enclosure 100 through the heat sinks 120 and to the back end 104 of the enclosure without being altered or blocked by a mid-plane circuit board. As such, the arrangement of the memory modules 110 and the motherboard 128 helps improve the ability for air to cool the memory modules 110 and therefore the enclosure 100.

Figure 6:
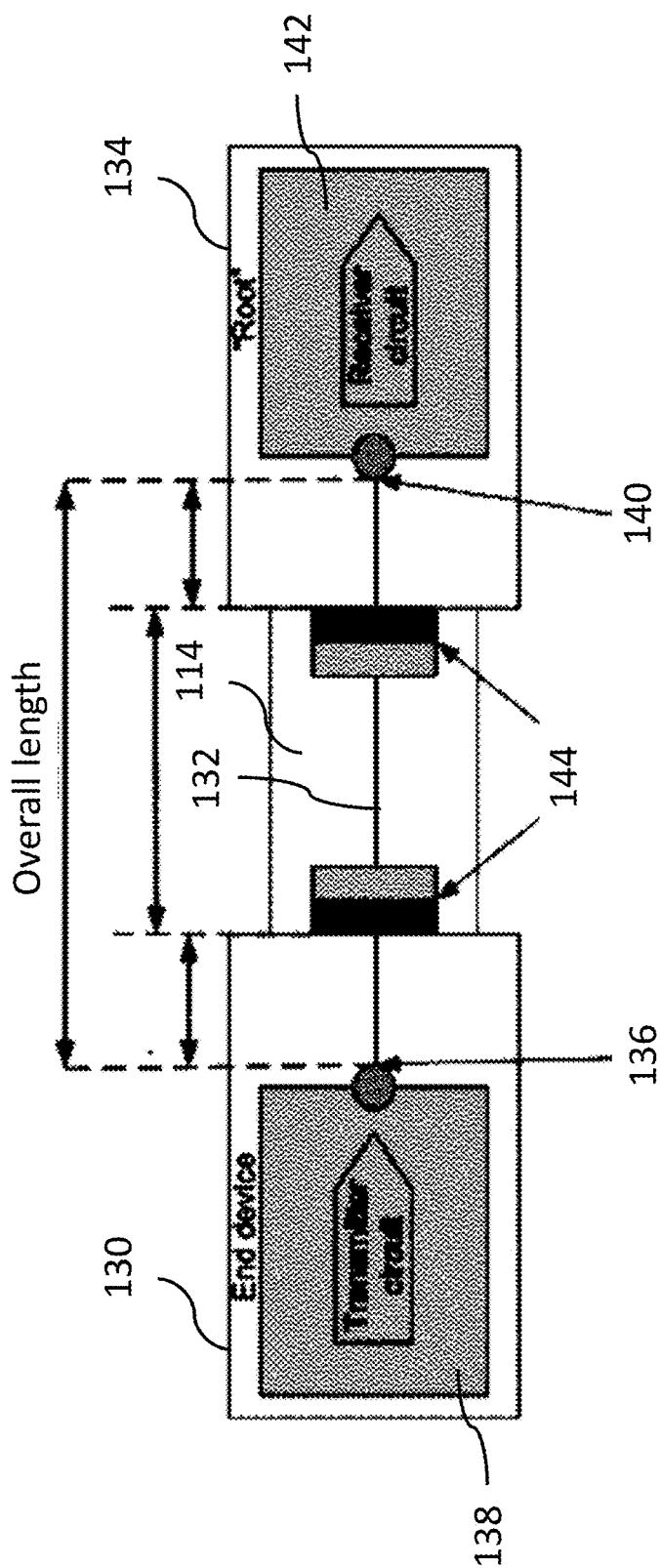
FIG. 6 shows a schematic of signal traces to memory modules, in accordance with certain embodiments of the present disclosure.

In addition to the cooling abilities, the arrangement of the memory modules 110 and the motherboard 128 can reduce the length of signal paths to the memory modules 110. FIG. 6 shows a side schematic view of a signal path or electrical trace 132 between one of the electrical connectors 130 mechanically coupled to the motherboard 128 and an electrical connector 134 of one of the memory modules 110. The electrical trace 132 begins at an output edge 136 of a transmitter circuit 138 of the electrical connector 130 and ends at an input edge 140 of a receiver circuit 142 of the electrical connector 134 of the memory module 110. Along the length of the electrical trace 132, signals pass through two interfaces 144 and the printed circuit board 114 of the memory module 110.

Reducing the length of the signal paths can improve the integrity of the signals communicated to and from the memory modules 110. Because the signals to and from the memory modules 110 do not have to pass through an intermediate mid-plane circuit board, the overall length of the electrical traces 132 can be reduced. For example, given the position of mid-plane circuit boards and the fact that mid-plane circuit boards may include airflow holes to allow air flow to pass through (and therefore lengthen signal paths), the signal paths would be relatively long compared to the present approach. As such, under the present approach, increasing signal integrity does not have to come at the expense of decreasing air flow through a mid-plane circuit board.

In certain embodiments, the overall length of the electrical traces 132 is 9 inches or less (e.g., 1-9 inches, 2-7 inches, 3-6 inches). In certain embodiments, the length of the electrical trace 132 between the output edge 136 and the first interface 144 is 2 inches or less. In certain embodiments, the length of the electrical trace 132 between the second interface 144 and the input edge 140 is 2 inches or less. And, the length between the two interfaces 144 can be less than 5 inches.

Signal integrity can also be improved over enclosures with mid-plane circuit boards because removing the mid-plane circuit board reduces the number of electrical connectors between the motherboard 128 and the memory modules 110. The more electrical connectors along the signal path, the more potential chances for signal losses exist due to impedance discontinuity and/or capacitance associated with the electrical connectors. Further, removing the mid-plane circuit board can reduce the overall cost of the bill of materials for the enclosure 100 because fewer components are required.

Figure 7:
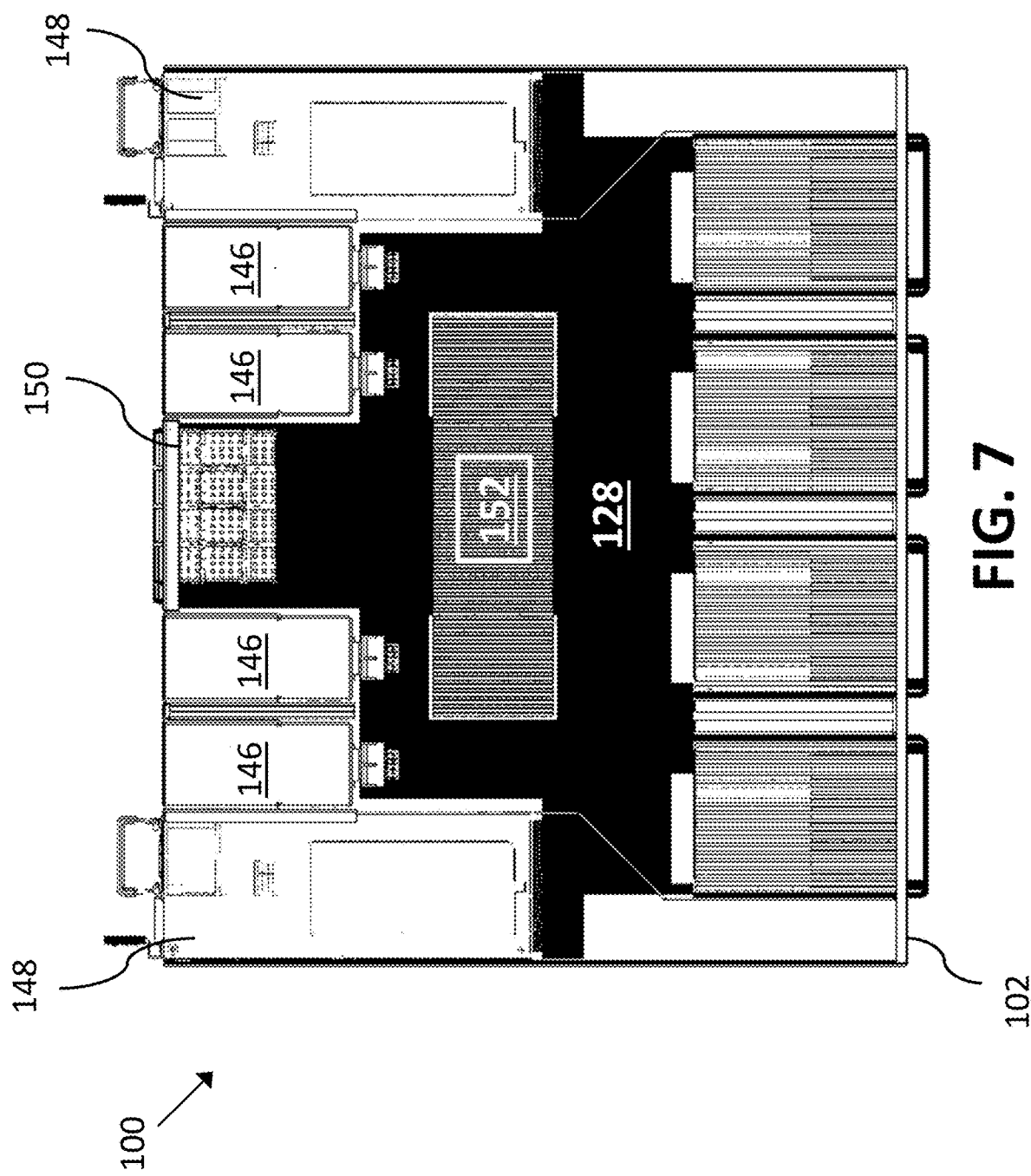
FIG. 7 shows a schematic top view of the enclosure of FIG. 2, in accordance with certain embodiments of the present disclosure.

FIG. 7 shows a top view of the enclosure 100. For simplicity, not all details shown in prior figures are shown in FIG. 7.

As shown in FIG. 7, the memory modules 110 and the heat sinks 120 are positioned near the front end 102 of the enclosure 100. Near the back end 104 of the enclosure 100 are air movers 146. In certain embodiments, the air movers 146 are fans (e.g., rotatory fans) with blades that are rotated by a motor such that the fans pull air from the front end 102 of the enclosure 100 to the back end 104 of the enclosure 100. The air movers 146, as well as other electrical components within the enclosure 100, are powered by power supply units 148. The power supply units 148 can be positioned near the back end 104 of the enclosure.

Also near the back end 104 of the enclosure are communication interfaces 150, which communicate data to and from the enclosure 100. In certain embodiments, the communication interfaces 150 are optical connectors. For example, the optical connectors can be octal small formfactor pluggable (OSFP) devices. The communication interfaces 150 are coupled to the motherboard 128 and are communicatively coupled to the memory modules 110.

The primary functions of the enclosure 100 can be managed by a central processing integrated circuit 152. The central processing integrated circuit 152 can manage the amount of power directed to the memory modules 110, the air movers 146, and other electrical components of the enclosure 100. The central processing integrated circuit 152 can also manage data transfers to and from the enclosure 100 and the memory modules 110. In certain embodiments, the central processing integrated circuit 152 comprises a field-programmable gate array (FPGA). In other embodiments, the central processing integrated circuit 152 comprises an application-specific integrated circuit (ASIC). Like the memory modules, the central processing integrated circuit 152 can generate heat during operation. Because of the arrangement of the memory modules 110, the heat sinks 120, and the motherboard 128, the ability to cool the central processing integrated circuit 152 is improved compared to enclosures with mid-plane circuit boards that inhibit air flow towards the back end of the enclosures.

Various modifications and additions can be made to the embodiments disclosed without departing from the scope of this disclosure. For example, while the embodiments described above refer to particular features, the scope of this disclosure also includes embodiments having different combinations of features and embodiments that do not include all of the described features. Accordingly, the scope of the present disclosure is intended to include all such alternatives, modifications, and variations as falling within the scope of the claims, together with all equivalents thereof.

I claim:

1. A system comprising:
   an enclosure having an air inlet end, an air outlet end, an upper wall, and a lower wall;
   air movers positioned near the air outlet end;
   a first memory module positioned near the air inlet end at a first orientation; and
   a second memory module positioned near the air inlet end at a second orientation that is opposite the first orientation.

2. The system of claim 1, wherein the first orientation is rotated approximately 180 degrees from the second orientation.

3. The system of claim 1, further comprising:
   a first heat sink coupled to the first memory module; and
   a second heat sink coupled to the second memory module.

4. The system of claim 3, wherein the first heat sink is positioned between the first memory module and the lower wall, wherein the second heat sink is positioned between the second memory module and the upper wall.

5. The system of claim 4, wherein the first heat sink includes a first plurality of fins, wherein the second heat sink includes a second plurality of fins.

6. The system of claim 3, wherein the first memory module includes a first printed circuit board, wherein the second memory module includes a second printed circuit board.

7. The system of claim 6, wherein the first printed circuit board and the first heat sink are positioned on opposite sides of the first memory module, wherein the second printed circuit board and the second heat sink are positioned on opposite sides of the second memory module.

8. The system of claim 1, wherein the first memory module includes a first memory integrated circuit and a first controller integrated circuit, wherein the second memory module includes a second memory integrated circuit and a second controller integrated circuit.

9. The system of claim 1, further comprising:
   a printed circuit board arranged to provide power to the first memory module and to the second memory module.

10. The system of claim 9, wherein the first memory module extends along a first plane, wherein the second memory module extends along a second plane, wherein the printed circuit board extends along a third plane that is between the first plane and the second plane.

11. The system of claim 9, wherein the printed circuit board is coupled to a first electrical connector arranged on a bottom side of the printed circuit board to communicate with the first memory module, wherein the printed circuit board is coupled to a second electrical connector arranged on a top side of the printed circuit board to communicate with the second memory module.

12. The system of claim 11, further comprising:
a first electrical trace communicatively coupled between the first electrical connector and the first memory module; and
a second electrical trace communicatively coupled between the second electrical connector and the second memory module, wherein the first electrical trace and the second electrical trace have respective total lengths of 8 inches or less.

13. The system of claim 1, wherein the enclosure does not include a midplane circuit board arranged to block air flow.

14. The system of claim 1, wherein the enclosure is a 1U enclosure, wherein the enclosure includes a first row of memory modules, which includes the first memory module, and a second row of memory modules, which includes the second memory module.

15. An enclosure comprising:
a chassis including a lower wall and an upper wall;
a first row of memory module assemblies;
a second row of memory module assemblies;
a first set of heat sinks respectively thermally coupled to one of the memory module assemblies in the first row, wherein the first set of heat sinks are positioned between the lower wall and the memory module assemblies in the first row; and
a second set of heat sinks respectively thermally coupled to one of the memory module assemblies in the second row, wherein the second set of heat sinks are positioned between the upper wall and the memory module assemblies in the second row.

16. The enclosure of claim 15, wherein the enclosure is a 1U enclosure.

17. The enclosure of claim 15, wherein the enclosure does not include a midplane circuit board arranged to block air flow.

18. The enclosure of claim 15, wherein the memory module assemblies each include memory integrated circuits and a controller integrated circuit.

19. The enclosure of claim 15, further comprising:
a printed circuit board arranged to provide power and data to the memory module assemblies via traces, wherein the traces are 3-6 inches long.

20. A method for cooling electronic components positioned within an enclosure, which has a top wall and a bottom wall, the method comprising:
operating air movers within the enclosure to pull air between a first set of fins of a first heat sink and between a second set of fins of a second heat sink;
wherein the first heat sink is connected to a first memory module and positioned between the bottom wall and the first memory module; and
wherein the second heat sink is connected to a second memory module and positioned between the top wall and the second memory module.

* * * * *